US010782900B2

(12) United States Patent
Chaiken et al.

(10) Patent No.: US 10,782,900 B2
(45) Date of Patent: Sep. 22, 2020

(54) SYSTEMS AND METHODS FOR CREATING AND/OR MODIFYING MEMORY CONFIGURATION SETTINGS

(71) Applicant: DELL PRODUCTS L.P., Round Rock, TX (US)

(72) Inventors: Craig Chaiken, Pflugerville, TX (US); Michael Arms, Pflugerville, TX (US); Vinod Makhija, Austin, TX (US); Stephen Cooper, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 156 days.

(21) Appl. No.: 16/116,002

(22) Filed: Aug. 29, 2018

(65) Prior Publication Data
US 2020/0073568 A1 Mar. 5, 2020

(51) Int. Cl.
*G06F 3/06* (2006.01)
*G06F 13/16* (2006.01)
*G06F 13/42* (2006.01)

(52) U.S. Cl.
CPC .......... *G06F 3/0632* (2013.01); *G06F 3/0604* (2013.01); *G06F 3/0659* (2013.01); *G06F 3/0673* (2013.01); *G06F 13/1668* (2013.01); *G06F 13/4282* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; G06F 3/0632; G06F 3/0604; G06F 3/0659; H04L 12/12; H04L 12/10
See application file for complete search history.

(56) References Cited

U.S. PATENT DOCUMENTS

| | | | | |
|---|---|---|---|---|
| 9,431,084 B2* | 8/2016 | Bose | ........................ | G11C 7/04 |
| 9,494,954 B2* | 11/2016 | Artman | .............. | G05D 23/1932 |
| 10,395,711 B2* | 8/2019 | Berger | ................ | G11C 11/1675 |
| 2006/0195708 A1* | 8/2006 | Kato | ...................... | G06F 1/206 |
| | | | | 713/300 |
| 2016/0141832 A1* | 5/2016 | Kanesaka | ............. | G02F 1/0123 |
| | | | | 372/34 |
| 2016/0314229 A1* | 10/2016 | Bickford | ................. | G06F 1/324 |
| 2016/0342115 A1* | 11/2016 | Takane | ............... | G03G 15/5004 |
| 2019/0332461 A1* | 10/2019 | Chaiken | .............. | G06F 11/3058 |
| 2020/0043529 A1* | 2/2020 | Shabbir | ................... | G06F 1/206 |

OTHER PUBLICATIONS

Wikipedia, "Memory Reference Code" obtained from Internet Jun. 12, 2018, 2 pgs.
Wikipedia, "Blue Screen of Death", obtained from Internet Aug. 23, 2018, 4 pages.
Wikipedia, "Memory Controller", obtained from Internet Aug. 13, 2018, 5 pages.

* cited by examiner

*Primary Examiner* — Zahid Choudhury
(74) *Attorney, Agent, or Firm* — Egan Peterman Enders Huston

(57) ABSTRACT

Systems and methods are provided for creating and/or modifying memory configuration settings (e.g., such as memory timing and memory drive voltage) for use at selected and/or varying memory temperature/s. The disclosed systems and methods may be implemented to create a relationship between optimized memory configuration settings for different memory temperatures during burn-in testing and/or on an ad-hoc basis.

20 Claims, 7 Drawing Sheets

| Temperature Threshold 1 | MRC Setting |
| Temperature Threshold 2 | MRC Setting |
| ... | ... |
| Temperature Threshold X | MRC Setting |

*FIG. 4*

SYSTEMS AND METHODS FOR CREATING AND/OR MODIFYING MEMORY CONFIGURATION SETTINGS

FIELD

This invention relates generally to information handling systems, and more particularly, to memory configuration settings for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One type of dynamic random access memory (DRAM) used for information handling systems are dual in-line memory modules (DIMMs). Failing DIMMs are a common cause for information handling system failures that cannot be duplicated when serviced for repair, which makes it difficult to identify the cause of a system failure and which parts of the system may be faulty. Such memory failures include failures that are thermally induced.

In an information handling system, memory reference code (MRC) is a part of the reference basic input/output system (BIOS) code run by a central processing unit (CPU), and is responsible for initializing DRAM memory (e.g., such as DIMMs) during power-on-self-test (POST). The MRC includes memory configuration setting information such as timing, driving voltage, etc. A single set of these memory configuration settings are configured by the MRC when the system is first booted, e.g., upon system power up. At that time, the MRC runs a "margining" test routine at the existing boot temperature during which the system memory is written to and read from at a single memory temperature while memory timing (frequency) and memory drive voltage are varied to determine a single set of tuned memory configuration settings to save for future use at all memory operating temperatures. This test routine is typically run early in the boot process while the memory temperature and temperature inside the information handling system chassis remains near room temperature.

During a MRC margining test routine, memory timing (frequency) is increased while writing to and reading from the memory until an upper margin frequency value is reached where an error occurs that causes the memory to fail, and the memory timing is also separately decreased until a lower margin frequency value is reached where an error occurs that causes the memory to fail. Then, a selected memory timing value is determined as the median timing frequency value between the determined upper margin frequency value and the determined lower margin frequency value. Similarly, a selected memory drive voltage value is determined to be the median memory drive voltage value between a similarly determined upper margin drive voltage value and lower margin drive voltage value. These selected values of memory timing and memory drive voltage are then saved to serial peripheral interface (SPI) Flash chip for future use by the system from then on. In some cases, the MRC may be programmed to re-run the test routine again after a defined number of future system boot occurrences have occurred or after a change in system memory chip/s.

SUMMARY OF THE INVENTION

Disclosed herein are systems and methods for creating and/or modifying memory configuration settings (e.g., such as memory timing and memory drive voltage) for use at selected and/or varying memory temperature/s. In one embodiment, multiple sets of different memory configuration settings may be created that are each for use while the current memory operating temperature lies within a corresponding different temperature range, e.g., each temperature range extends above and below a memory operating temperature at which the given set of memory configuration settings is derived.

In one embodiment, the disclosed systems and methods may be implemented to create a relationship between optimized memory configuration settings for different memory temperatures during burn-in testing (e.g., such as during system fabrication at the factory or later in the field when warranted by changes in system memory configuration), and/or on an ad-hoc basis (e.g. such as in the field by the user). In one embodiment, system BIOS may be programmed to build a table of memory configuration settings that are applied as the system memory (e.g., DRAM dual inline memory modules) temperature changes in a manner that help assure that the memory is always operated with an optimized memory timing and drive voltage configuration. Such a table may be built by a user initiated burn-in test or may be built in an ad-hoc manner (e.g., such as when the MRC runs while the memory is at a given temperature so that the given temperature and its determined memory configuration data may be added to the memory configuration setting table). Besides DRAM DIMMs, the disclosed systems and methods may be implemented for any other type of random access memory (RAM) for which memory configuration parameters such as memory timing and/or memory drive voltage may be varied and are configurable.

In one embodiment, the disclosed systems and methods may be implemented to use a MRC to build a pre-existing stored relationship (e.g., a lookup table) between different values of memory configuration settings that are optimized for different memory operating temperatures. Then, during runtime, where a memory configuration setting entry already exists that corresponds to a new and different measured memory temperature, the disclosed systems and methods may be further implemented to dynamically and non-destructively determine and load the memory configuration settings for the memory controller from the pre-existing that correspond to the newly measured runtime memory temperature, while at the same time replacing any previously-loaded stale memory configuration settings that correspond to another different runtime memory temperature. Since new memory configuration settings are selected from a pre-existing stored relationship, the memory configuration settings may be dynamically changed to match current memory temperature without incurring data loss, which would be the case if an attempt were made to use a conventional data-destructive MRC technique to determine new memory configuration settings in real time for a new memory temperature.

In a further embodiment, where a memory configuration setting entry does not already exist that corresponds to a new and different measured memory temperature, then MRC may be implemented to retrain the system memory at the new measured memory temperature to create an memory configuration setting entry for the new measure memory temperature.

In another embodiment, the disclosed systems may utilize optimized memory configuration settings that are selected in real time and during runtime that is based on current memory operating temperature. This is unlike conventional MRC operation, where the MRC selects the same fixed memory configuration settings for use at all memory operating temperatures, i.e., the conventional MRC always uses the same memory configuration settings that were set at initial boot or that were set the last time that the memory configuration was changed (only one set of memory configurations is ever stored), which means that there is a very low chance that the conventionally-derived single set of memory configuration settings match the current memory temperature. In this regard, a conventional MRC operates to determine a single set of memory configuration settings one time very early in a given boot process and at an arbitrary testing temperature that is without regard to actual system operating temperature. The conventional MRC never re-evaluates these determined memory configuration settings as actual memory operating temperature increases. As such, conventionally-determined MRC memory configuration settings are not ideal for all expected temperatures, which results in memory operation that is less reliable, and in some cases unreliable, at relative cold and hot temperatures that deviate much from the initial arbitrary test temperature. In this regard, relatively higher memory drive voltages and relatively lower memory timing frequencies are required at high temperatures, and vice-versa.

Thus, the disclosed systems and methods may be implemented to prevent memory "cannot duplicate" failures by avoiding circumstances in which memory timing and drive strength settings become out of specification as memory chip operating temperature increases or otherwise changes. This in turn, reduces unnecessary product returns or repair attempts on good memory parts to address non-permanent thermally-induced memory failures. Moreover, the disclosed systems and methods may be advantageously for ruggedized equipment that encounter wide variations in operating temperature, such as rugged platform laptop, notebook and tablet computers utilized out-of-doors, such as by the military, construction personnel, etc.

In one respect, disclosed herein is a method, including: operating an information handling system that includes at least one programmable integrated circuit coupled to random access memory (RAM) and coupled to non-volatile memory (NVM); using the programmable integrated circuit of the system to create and/or modify memory configuration settings for the RAM by performing the following memory configuration setting determination steps for each given one of multiple different RAM operating temperatures: reading data to and writing data from the RAM while varying the value of at least one memory configuration parameter until one or more errors occur while reading data to and writing data from the RAM, and selecting a designated value of the memory configuration parameter for use at the given RAM operating temperature where no error occurred while reading data to and writing data from the RAM. The method may also include: creating a relationship between different given RAM operating temperatures and the designated memory configuration setting value designated for use at each one of the different given RAM operating temperatures; and storing the created relationship as memory configuration settings in the NVM of the information handling system.

In another respect, disclosed herein is a method, including: a) operating an information handling system that includes at least one programmable integrated circuit coupled to random access memory (RAM) and coupled to non-volatile memory (NVM); b) sensing a current operating temperature of the RAM while operating the information handling system; c) then using the programmable integrated circuit of the information handling system to access a relationship stored on the NVM between different given RAM operating temperatures and corresponding memory configuration setting values for at least one memory configuration parameter designated for use at each one of the different given RAM operating temperatures; d) then selecting and retrieving a memory configuration setting value from the NVM that is designated for use at the current sensed operating temperature of the RAM; and e) then reading and writing from the RAM using the current selected memory configuration setting value designated for use at the current sensed operating temperature of the RAM.

In another respect, disclosed herein is an information handling system, including: system random access memory (RAM); system non-volatile memory (NVM); at least one temperature sensor; at least one programmable integrated circuit coupled to the system RAM and the system NVM. The at least one programmable integrated circuit may be programmed to: a) sense a current operating temperature of the RAM while operating the information handling system, b) then access a relationship stored on the NVM between different given RAM operating temperatures and corresponding memory configuration setting values for at least one memory configuration parameter designated for use at each one of multiple different given RAM operating temperatures, c) then select and retrieve a memory configuration setting value from the NVM that is designated for use at the current sensed operating temperature of the RAM, and d) then read and write from the RAM using the current selected memory configuration setting value designated for use at the current sensed operating temperature of the RAM.

BRIEF DESCRIPTION OF THE DRAWINGS

FIG. 4 illustrates a memory configuration table according to one exemplary embodiment of the disclosed systems and methods.

DESCRIPTION OF ILLUSTRATIVE EMBODIMENTS

Figure 1:
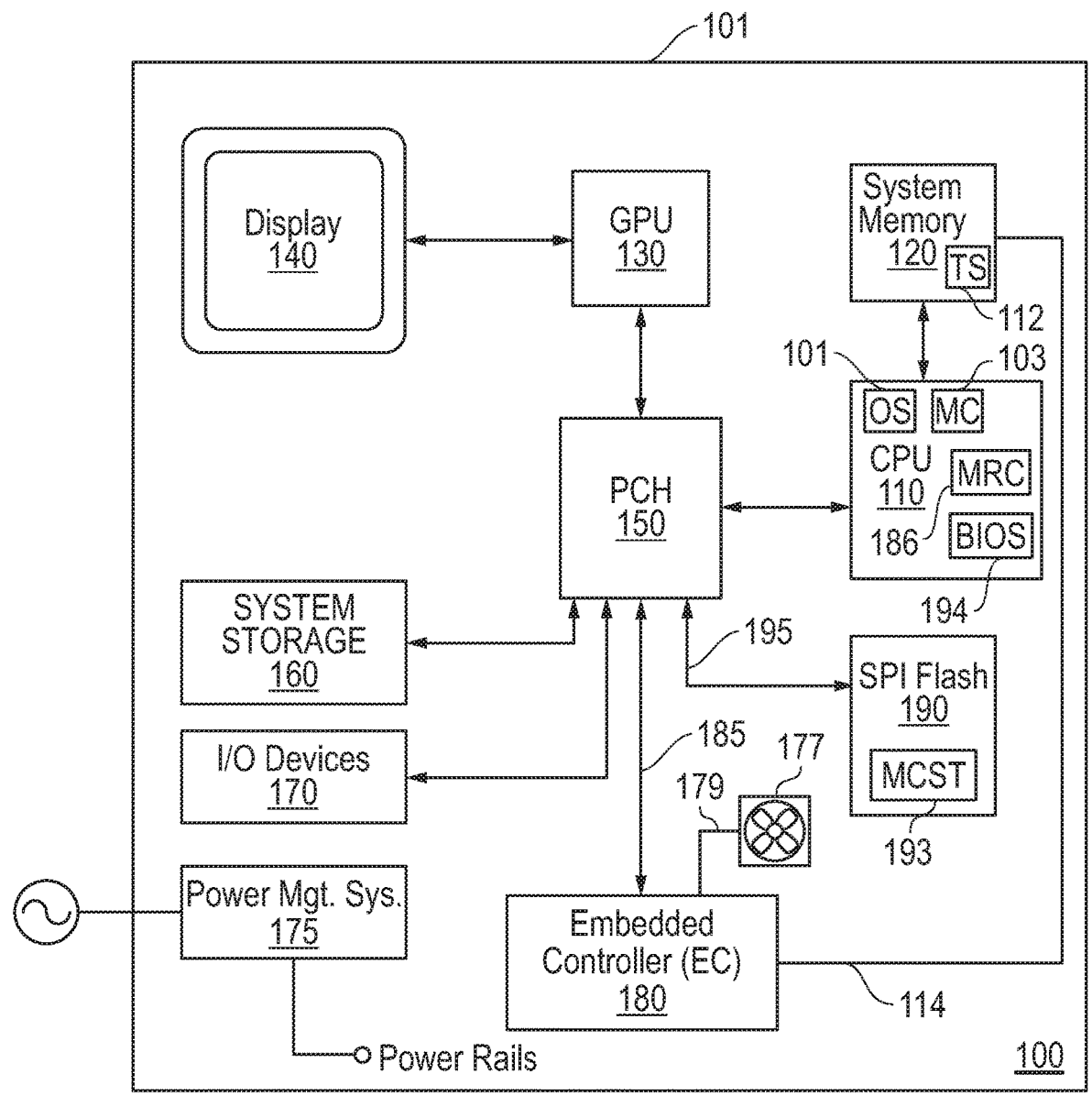
FIG. 1 is a block diagram of an information handling system according to one exemplary embodiment of the disclosed systems and methods.

FIG. 1 is a block diagram of an information handling system 100 (e.g., a desktop computer, laptop computer, tablet computer, MP3 player, personal data assistant (PDA), cell phone, etc.) as it may be configured according to one embodiment of the present disclosure. In this regard, it should be understood that the configuration of FIG. 1 is exemplary only, and that the disclosed methods may be implemented on other types of information handling systems. It should be further understood that while certain components of an information handling system are shown in FIG. 1 for illustrating embodiments of the present disclosure, the information handling system is not restricted to including only those components shown in FIG. 1 and described below.

As shown in FIG. 1, information handling system 100 may generally include one or more host programmable integrated circuits, such as a central processing unit (CPU) 110, for executing an operating system (OS) 101 for system 100, executing a memory reference code (MRC) 186 (e.g., Intel or AMD MRC), etc. CPU 110 may also be configured to access SPI Flash 190 to load and boot the system BIOS 194 as shown. CPU 110 may include any type of processing device, such as an Intel Pentium series processor, an Advanced Micro Devices (AMD) processor or another processing device. CPU 110 is coupled to system memory 120, which may include, for example, random access memory (RAM), dynamic RAM (DRAM), synchronous DRAM (SDRAM), and other suitable storage mediums for which memory configuration parameters such as memory timing and/or memory drive voltage may be varied and are configurable.

In one exemplary embodiment, system memory may be DRAM that is configured as dual in-line memory modules (DIMMs). Memory controller (MC) 103 may be present in CPU for managing the flow of data between CPU 110 and system memory 120 according to memory configuration settings (e.g., timing, driving voltage, etc.) selected to correspond to the current temperature of system memory 120 as described elsewhere herein. It will be understood that the configuration of FIG. 1 is exemplary only, and that in other embodiments tasks of MC 103 may be performed by a memory controller positioned in a memory controller hub positioned between the CPU and the system memory, or using any other suitable memory controller and memory architecture. Moreover, the role and tasks of SPI Flash 190 described herein may be performed by any other suitable one or more non-volatile memory (NVM) devices, e.g., including solid state drive/s (SSDs), hard drive/s, etc.

In some embodiments, information handling system 100 may include other types of processing devices including, but not limited to, a graphics processor unit (GPU) 130, a graphics-derivative processor (such as a physics/gaming processor), a digital signal processor (DSP), etc. Although GPU 130 is shown as a separate processing device in the embodiment of FIG. 1, GPU 130 may be omitted in other embodiments, when the functionality provided thereby is integrated within CPU 110 in a system-on-chip (SoC) design. In FIG. 1, display device 140 (e.g., LCD display or other suitable display device) is coupled to graphics processing unit (GPU) 130 to provide visual images (e.g., a graphical user interface, static images and/or video content) to the user. GPU 130 is, in turn, coupled to CPU 110 via platform controller hub 150.

Platform controller hub (PCH) 150 controls certain data paths and manages information flow between components of the information handling system. As such, PCH 150 may include one or more integrated controllers or interfaces for controlling the data paths connecting PCH 150 with CPU 110, GPU 130, system storage 160, input/output (I/O) devices 170, embedded controller (EC) 180 and SPI Flash memory device 190 where BIOS firmware image (e.g., BIOS 194) is stored. In one embodiment, PCH 150 may include a Serial Peripheral Interface (SPI) controller and an Enhanced Serial Peripheral Interface (eSPI) controller. In some embodiments, PCH 150 may include one or more additional integrated controllers or interfaces such as, but not limited to, a Peripheral Controller Interconnect (PCI) controller, a PCI-Express (PCIe) controller, a low pin count (LPC) controller, a Small Computer Serial Interface (SCSI), an Industry Standard Architecture (ISA) interface, an Inter-Integrated Circuit ($I^2C$) interface, a Universal Serial Bus (USB) interface and a Thunderbolt™ interface.

Local system storage 160 (e.g., one or more media drives, such as hard disk drives, optical drives, NVRAM, Flash memory, solid state drives (SSDs), or any other suitable form of internal or external storage) is coupled to PCH 150 to provide permanent storage for information handling system 100. I/O devices 170 (e.g., a keyboard, mouse, touchpad, touchscreen, etc.) are coupled to PCH 150 to enable the user to interact with information handling system 100, and to interact with application programs or other software/firmware executing thereon.

A power source for the information handling system 100 may be provided via an external power source (e.g., mains power) and an internal power supply regulator, and/or by an internal power source, such as a battery. As shown in FIG. 1, power management system 175 may be included within information handling system 100 for moderating the available power from the power source. In one embodiment, power management system 175 may be coupled to provide operating voltages on one or more power rails to one or more components of the information handling system 100, as well as to perform other power-related administrative tasks of the information handling system. For example, power management system 175 may be coupled to provide an operating voltage on a primary power rail to PCH 150, and may be further coupled to provide an operating voltage (e.g., 3.3V) on another power rail to EC 180. In addition to the power rails explicitly shown in FIG. 1, it is noted that power management system 175 may be coupled to provide additional operating voltages on one or more additional power rails to PCH 150, EC 180 and other components of information handling system 100.

Embedded controller (EC) 180 is coupled to PCH 150 and may be configured to perform functions such as power/thermal system management, etc. EC 180 may also be configured to execute program instructions to boot information handling system 100, load application firmware from SPI Flash memory device 190 into internal memory, launch the application firmware, etc. In one example, EC 180 may include a processing device for executing program instructions to perform the above stated functions. Although not strictly limited to such, processing device of EC 180 may be implemented as a programmable integrated circuit (e.g., a controller, microcontroller, microprocessor, ASIC, etc., or as a programmable logic device "PLD" such as FPGA, complex programmable logic device "CPLD", etc.).

As shown in FIG. 1, EC 180 is coupled to PCH 150 via data bus 185, and SPI Flash memory device 190 is coupled to PCH 150 via data bus 195. According to one embodiment, data bus 195 is a Serial Peripheral Interface (SPI) bus, and data bus 185 is an Enhanced Serial Peripheral Interface (eSPI) bus. In the embodiment shown in FIG. 1, SPI Flash memory device 190 is a shared Flash memory device, which is connected to PCH 150 and EC 180. In such a configuration, PCH 150 provides EC 180 shared access to SPI Flash memory device 190 via eSPI bus 185, SPI bus 195 and various interface and logic blocks included within the PCH. EC 180 is also coupled as shown by data bus 114 to read real time temperature of memory system temperature sensor 112 (e.g., thermistor placed on or near memory components of system memory 120), and to provide this real time temperature via PCH 150 and EC Mailbox Interface to BIOS 194 executing on CPU 110. System and/or memory cooling fan/s 177 are also present to circulate cooling air through chassis enclosure 101 of information handling system 100, and may be controlled by pulse width modulation (PWM) control signals 179 provided by EC 180 as shown. In some embodiments, dedicated memory cooling fans 177 may be present to preferentially cool system memory (e.g., DIMMs) 120, and may be controlled separately by EC 180 to cool system memory 120 based on memory temperature reported to EC 180 by temperature sensor 112.

As shown in FIG. 1, a relationship 193 of different memory configuration setting values at different memory temperatures ("MCST") for system memory 120 may be stored on SPI Flash memory device 190 by MRC 186 executing on CPU 110. In one exemplary embodiment MCST 193 may be a lookup table as described further herein, although any other suitable relationship between memory configuration setting values and memory temperature may be employed. Further, although MRC 186 is shown executed in FIG. 1 by CPU 110, it will be understood that MRC 186 may be alternately loaded from any suitable non-volatile memory (NVRAM) and executed by any other suitable processing device or system 100, e.g., such as EC 180, etc. Moreover, MCST 193 may alternatively be stored on any other suitable non-volatile memory component, e.g., such as Flash memory device that is directly coupled to EC 180, system storage 160, etc. In this regard, for purposes of illustration, MRC 186 and BIOS 194 are described below as being implemented on CPU 110 to perform certain aspects of the processes and methodologies of FIGS. 2, 3A, 3B, 5 and 6. However, it will be understood that some or all aspects of these processes and methodologies may alternative be performed by EC 180 and/or by other processing device/s of system 100.

Figure 2:
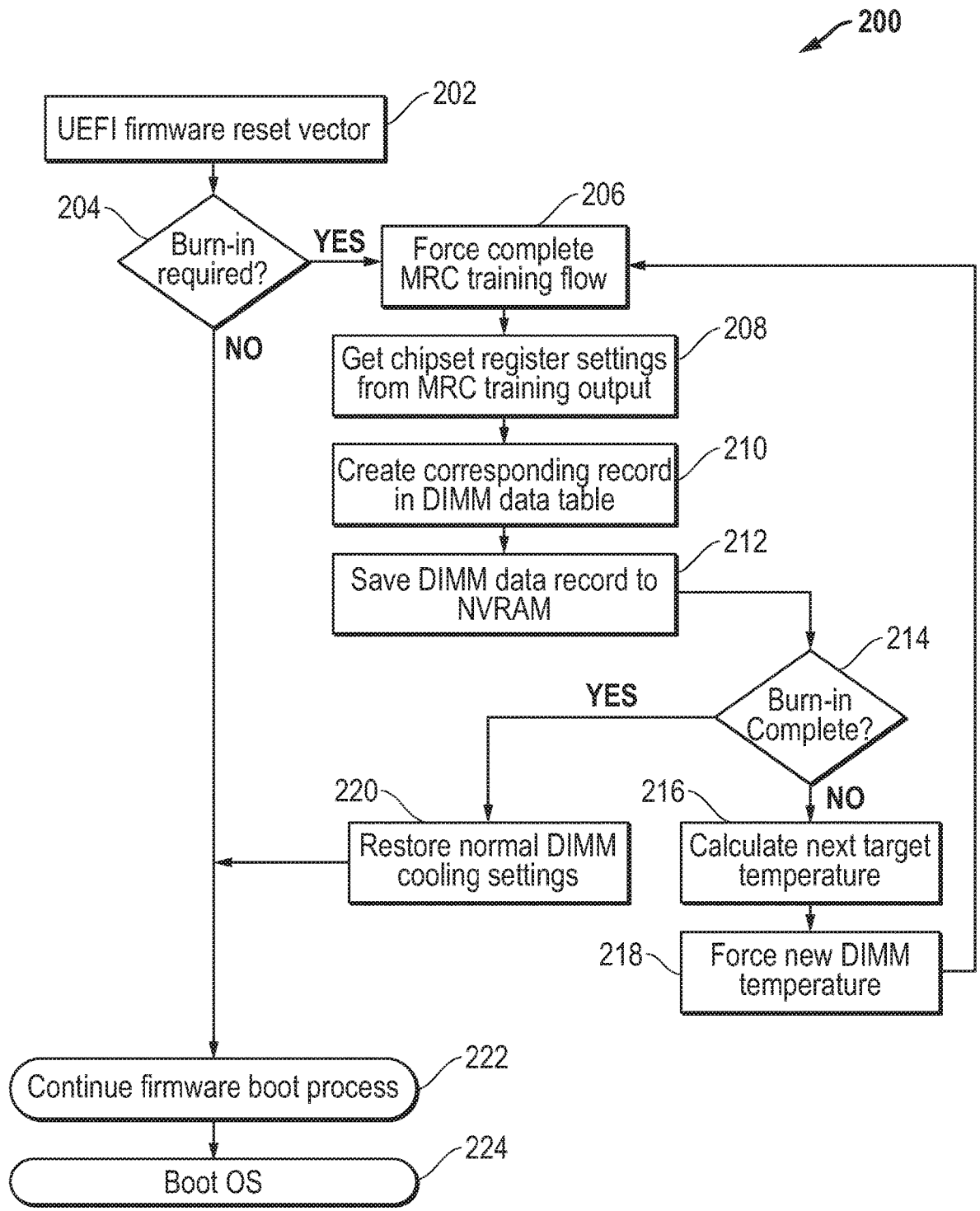
FIG. 2 illustrates a memory burn-in process according to one exemplary embodiment of the disclosed systems and methods.

FIG. 2 illustrates one exemplary embodiment of a memory burn-in process 200 that may be implemented (e.g., by BIOS 194 and MRC 186 executing on CPU 110) to create multiple sets of memory configuration setting values for system memory 120 (e.g., one or more DIMMs) at multiple different predefined target memory temperatures. In one embodiment, process 200 may be performed to determine memory configuration setting values that have the widest margin at which system memory 120 will not fail while being read to and written to at each of the multiple different predefined target memory temperatures. Burn-in process 200 may be performed, for example, during system assembly at the factory, or later in the field by the end user or a repair technician. As shown, methodology 200 starts in step 202 with UEFI BIOS reset vector (e.g., at system power up or system reset such as restart or any other operation that causes system reboot) pointing CPU 110 to load UEFI BIOS 194 from SPI Flash 190.

UEFI BIOS 194 then determines in step 204 whether memory configuration burn-in is currently required. A variety of different criteria may be employed in step 204 to determine whether memory configuration burn-in is required. For example, in one embodiment, step 204 may determine that memory configuration burn-in is required where no existing memory configuration setting values for system memory 120 are found stored on SPI Flash 190. This may be the case, for example, during first time boot of the system, e.g., at the factory where the system is assembled. Alternatively, this may be the case where any existing memory configuration setting values have been previously deleted from SPI Flash 190, e.g., by the end user or a repair technician. In another possible embodiment, a memory burn-in flag to indicate that memory burn-in testing is required may be set before the current boot instance in SPI Flash 190 (e.g., stored in SPI Flash 190 before the first time boot, or set later by an end user or repair technician in the field). In the latter case, MRC 186 may clear any memory burn-in flag after completion of burn-in testing process 200.

In another embodiment, BIOS 194 may in step 204 determine to prompt a human user of system 100 to initiate memory configuration burn-in according to burn-in testing process 200 (e.g., by displaying a visual and/or text prompt to the user on GUI 140) when a "NEED_BURNIN" NVRAM variable in SPI Flash 190 is set to non-zero. The human user may respond to this prompt by inputting a user command to CPU 110 to initiate the burn-in testing process 200. Once the burn-in testing process 200 of FIG. 2 executes and completes, the "NEED_BURNIN" NVRAM variable is set to zero to indicate to BIOS 194 that no burn-in testing is to be performed, and the human user of system 100 will never be prompted to again initiate the memory configuration burn-in testing process 200 unless one or more components of system memory 120 (e.g., memory DIMMs) change, or upon occurrence of other possible selected conditions. For example, BIOS 194 may set the "NEED_BURNIN" NVRAM variable to be non-zero under one or more of the following conditions: 1) A system memory configuration change has been detected; 2) an error-correcting code (ECC) memory failure is detected and no burn-in testing process has been previously performed; 3) an NVRAM variable called BugCheckCode on SPI Flash 190 is updated by the OS via Extensible Firmware Interface (EFI) Runtime code; 4) periodically according to defined time interval (e.g., one time per year); 5) detection of system "Blue Screen of Death" (BSOD) occurrence or other fatal system error or system crash where the OS is no longer able to operate safely, etc.

If it is determined in step 204 that no memory burn-in testing is required, then process proceeds to step 222 where the normal system firmware boot process is continued and OS 101 booted in step 224 without any memory burn-in testing. However, if step 204 determines that memory burn-in testing is required then process proceeds to step 206, where BIOS 194 forces execution of a complete burn-in training process at the current memory temperature by MRC 186.

Figure 3A:
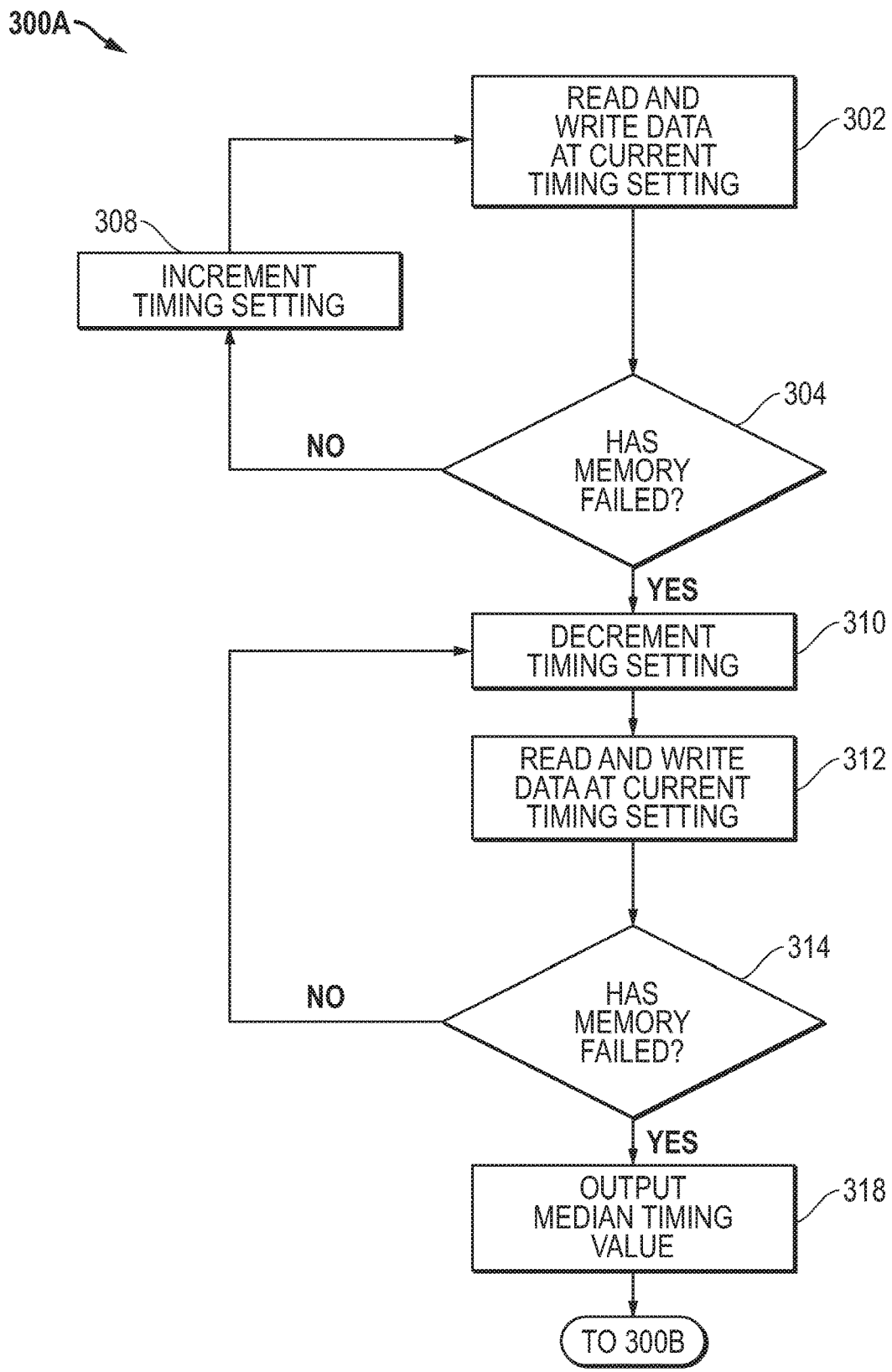
FIG. 3A illustrates memory reference code (MRC) training flow according to one exemplary embodiment of the disclosed systems and methods.
Figure 3B:
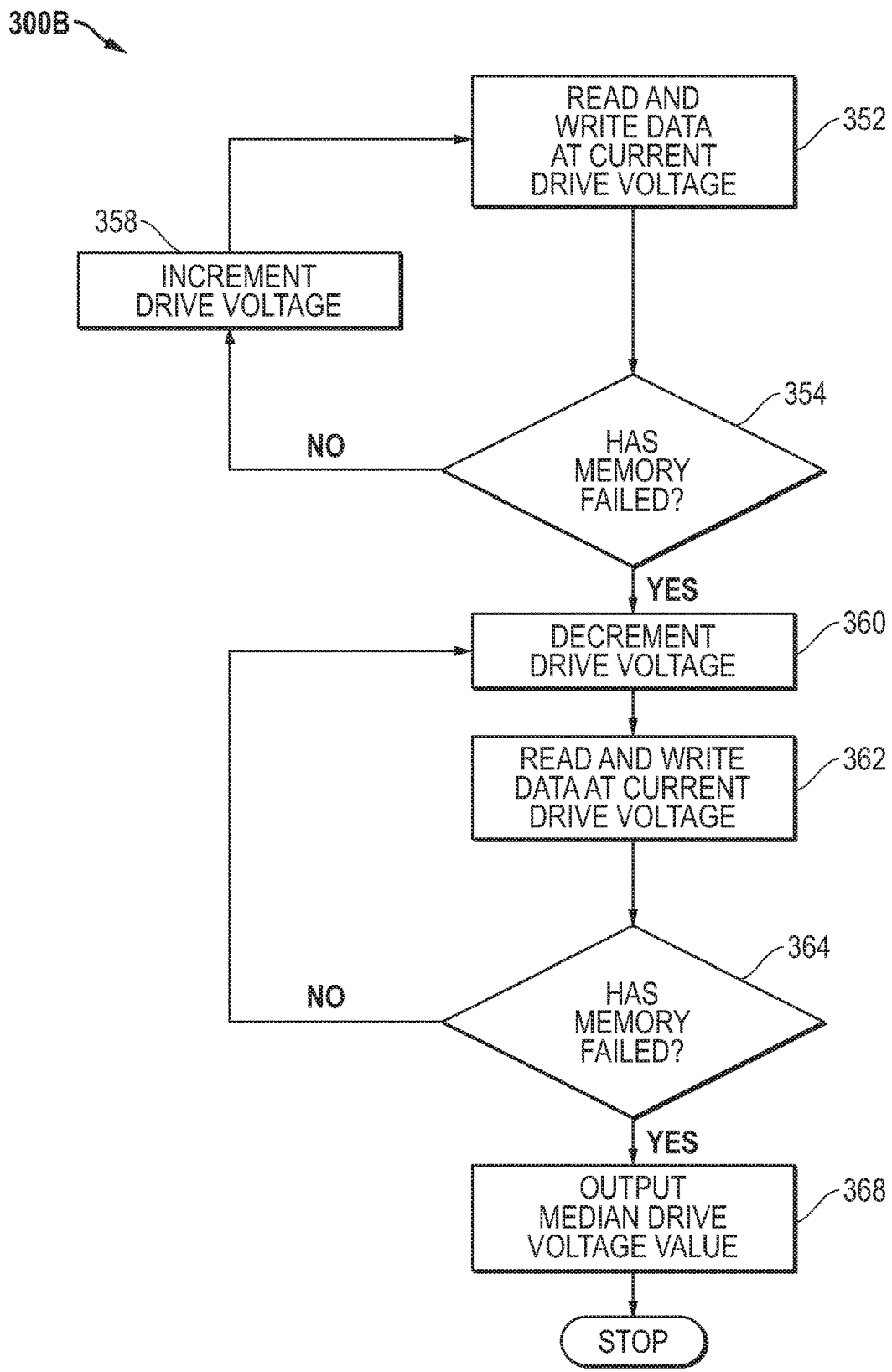
FIG. 3B illustrates memory reference code (MRC) training flow according to one exemplary embodiment of the disclosed systems and methods.

FIGS. 3A and 3B illustrate one embodiment of MRC training flows 300A and 300B such as industry-standard margining test routines that may be performed by MRC 186 in step 206, it being understood that any other combination and/or sequence of steps may be alternatively employed to test memory operation using varying memory configuration parameters, e.g., such as memory timing (frequency) and/or memory drive voltage. For example, it will be understood that the steps of FIG. 3B may be alternately performed before steps of FIG. 3A, and/or that the memory timing and/or drive voltage parameters may be alternatively decremented before incremented.

Training flow 300A of FIG. 3A begins with step 302 where data is written to, and read from, system memory 120 at the current memory temperature as reported by temperature sensor 112. Default memory timing values and memory drive voltage values may be used for the first iteration of training flow 300A. In one exemplary embodiment, default memory timing and memory drive voltages may be stored values that are read by MRC 186 from serial presence detect (SPD) read-only memory (ROM) on each DRAM (e.g., DIMM). As shown in FIG. 3B, the default drive voltage value may be held constant throughout flow 300A while memory timing values are varied as described. If it is determined in step 304 that no memory error has occurred and system memory 120 has not failed, then the memory timing is incremented in step 308 and steps 302 to 304 are repeated at the incremented memory timing value and the default memory drive voltage value. In this regard, incremental values may be determined as needed to fit a given application, e.g., by chipset designers.

When it is determined in step 304 that a memory error has occurred and system memory 120 has failed at the current memory temperature, then a maximum memory timing value has been determined for the current memory temperature. Then flow 300A proceeds to step 310 where the default memory timing value is decremented. Data is the written to, and read from, system memory 120 in step 312 at the default memory drive voltage value and the decremented memory timing value. If it is determined in step 314 that no memory error has occurred and system memory 120 has not failed, then flow 300A repeats to step 310 where the memory timing value is again decremented and steps 312 to 314 repeated at the decremented memory timing value and the default memory drive voltage value. When it is determined in step 314 that a memory error has occurred and system memory 120 has failed at the current memory temperature, then a minimum memory timing value has been determined for the current memory temperature. Then flow 300A proceeds to step 318, where a median memory timing value between the determined maximum memory timing value and the determined median memory timing value is calculated and output to chipset registers as MRC setting information. Training flow 300A then proceeds to training flow 300B of FIG. 3B.

Training flow 300B of FIG. 3B begins with step 352 where data is written to, and read from, system memory 120 at the current memory temperature as reported by temperature sensor 112. As before, default memory timing values and memory drive voltage values may be used for the first iteration of training flow 300B, and the default memory timing value may be held constant throughout flow 300B while memory drive voltage values are varied as described. If it is determined in step 354 that no memory error has occurred and system memory 120 has not failed, then the memory drive voltage is incremented in step 358 and steps 352 to 354 are repeated at the incremented memory drive voltage value and the default memory timing value.

When it is determined in step 354 that a memory error has occurred and system memory 120 has failed at the current memory temperature, then a maximum memory drive voltage value has been determined for the current memory temperature. Then flow 300B proceeds to step 360 where the default memory drive voltage value is decremented. Data is then written to, and read from, system memory 120 in step 362 at the default memory timing value and the decremented memory drive voltage value. If it is determined in step 364 that no memory error has occurred and system memory 120 has not failed, then flow 300A repeats to step 360 where the memory drive voltage value is again decremented and steps 362 to 364 repeated at the decremented memory drive voltage value and the default memory timing value. When it is determined in step 364 that a memory error has occurred and system memory 120 has failed at the current memory temperature, then a minimum memory drive voltage value has been determined for the current memory temperature. Then flow 300B proceeds to step 368, where a median memory drive voltage value between the determined maximum memory drive voltage value and the determined median memory drive voltage value is calculated and output to as MRC setting information to chipset registers. Training flow 300B then ends.

Returning to FIG. 2, process 200 then proceeds to step 208 where the most recent chipset register MRC settings are retrieved from the MRC training output created in the steps of FIGS. 3A and 3B. These chipset register MRC settings include the determined median memory timing value and median memory drive voltage value for the current memory temperature reported by temperature sensor 112. The chipset register MRC settings are used in step 210 to create a data record that includes the determined MRC settings measured in the latest iteration of MRC training flow of FIGS. 3A-3B corresponding to the current temperature reported by temperature sensor 112 to CPU 110. In one embodiment, this data record is then saved to MCST 193 (e.g., as a memory configuration table entry of a DIMM table) on system NVRAM (e.g., SPI Flash 160) for later use by a BIOS thermal event handler executed by CPU 110. As shown in the exemplary embodiment of FIG. 4, DIMM data table of MCST 193 includes a memory configuration table entry (or data row) for each temperature threshold which corresponds to the current temperature at which the determined MRC settings were selected. Each MRC setting memory configuration table entry may include one or more memory configuration parameters, e.g., memory timing (measured in megahertz) and/or memory drive strength (measured in millivolts) for a given memory temperature. It will be understood that the threshold information and number of table entries may be information handling system platform-specific, e.g., to fit the memory specific configuration of a given system platform.

After step 212, process 200 proceeds to step 214 where it is determined whether the memory burn-in testing is completed. Criteria for determine when the memory burn-in testing is complete includes, for example, a determination that MRC training flow of FIGS. 3A and 3B has been executed for all different predefined target system memory temperatures, e.g., up to the maximum supported temperature of system memory 120, or where the memory operating temperature stops rising for a defined timeout period indicating that it is not possible to hit the maximum supported temperature of system memory 120. If the memory burn-in is not complete in step 214, then process 200 proceeds to step 216, where a new and next predefined target memory temperature for testing during the next MRC training flow sequence is calculated, e.g., by increasing the target temperature by a predefined incremental amount ($\Delta T$), such as an increase of 5° C. or any other selected greater or lesser value. Incremental temperature ranges ΔT may in one embodiment determined as needed to fit a given application, e.g., by chipset designers.

Next, the calculated new target temperature is intentionally forced to occur by CPU 110 in step 218. This may be accomplished using any technique suitable for incrementally increasing the temperature of system memory 120. For example, memory temperature may be increased by using CPU 110 to run a memory stress test to sequentially read to and write from the system memory 120 in rapid succession at a high rate of speed (e.g., writing and reading continuously from multiple CPU cores concurrently), until the current memory temperature reported by temperature sensor 112 increases to match the target temperature of step 216 for the next MRC execution. During this time CPU 110 may optionally cause EC 180 to also disable system or memory cooling fan/s 177 (or slow down system or memory cooling fan/s 177) as may be necessary to allow the current temperature of the system memory 120 to rise to the new target temperature of the current iteration. This may be accomplished, for example, by using a fan control diagnostic application programming interface (API) to disable CPU fan support. Process 200 then proceeds to step 206, and steps 203 to 212 are repeated again at the new higher target temperature. As before, chipset register MRC settings are used in step 210 to create a data record that includes the MRC settings measured in the latest iteration of MRC training flow of FIGS. 3A-3B corresponding to the new higher current target memory temperature reported by temperature sensor 112 via EC 180 to CPU 110, and this data record is then saved to MCST 193 and stored on system NVRAM (e.g., SPI Flash 160).

Example ranges of relatively hot elevated memory temperatures above ambient temperature (e.g., such as an ambient room temperature of 23° C.) that may be forced during step 218 of FIG. 2 include, but are not limited to, elevated memory temperatures greater than 40° C., elevated memory temperatures greater than 80° C., elevated memory temperatures greater than 120° C., elevated memory temperatures greater than 160° C., memory temperatures greater than 180° C., elevated memory temperatures between 40° C. and 180° C., elevated memory temperatures between 80° C. and 180° C., and elevated memory temperatures between 160° C. and 180° C. However, step 218 may be performed to force other greater or lesser memory temperatures. In this regard, steps 206 to 212 may be performed to create and save MRC setting data records at relatively cold memory operating temperatures below room temperature, e.g., at memory temperatures less than −50° C., alternatively at from less than 21° down to −50° C., alternatively between 0° C. and −50° C., alternatively between −25° C. and −50° C. In one embodiment, steps 206 to 212 may be performed over a range of memory temperatures from −50° C. to 180° C.

Process 200 continues to repeat by executing the MRC training flow (e.g., at regular temperature intervals) until it is determined in step 214 that the burn-in testing is complete as previously described. Then process 200 proceeds to step 220 where normal cooling of system memory 120 is enabled by CPU 110, and normal system firmware boot process is continued.

Figure 5:
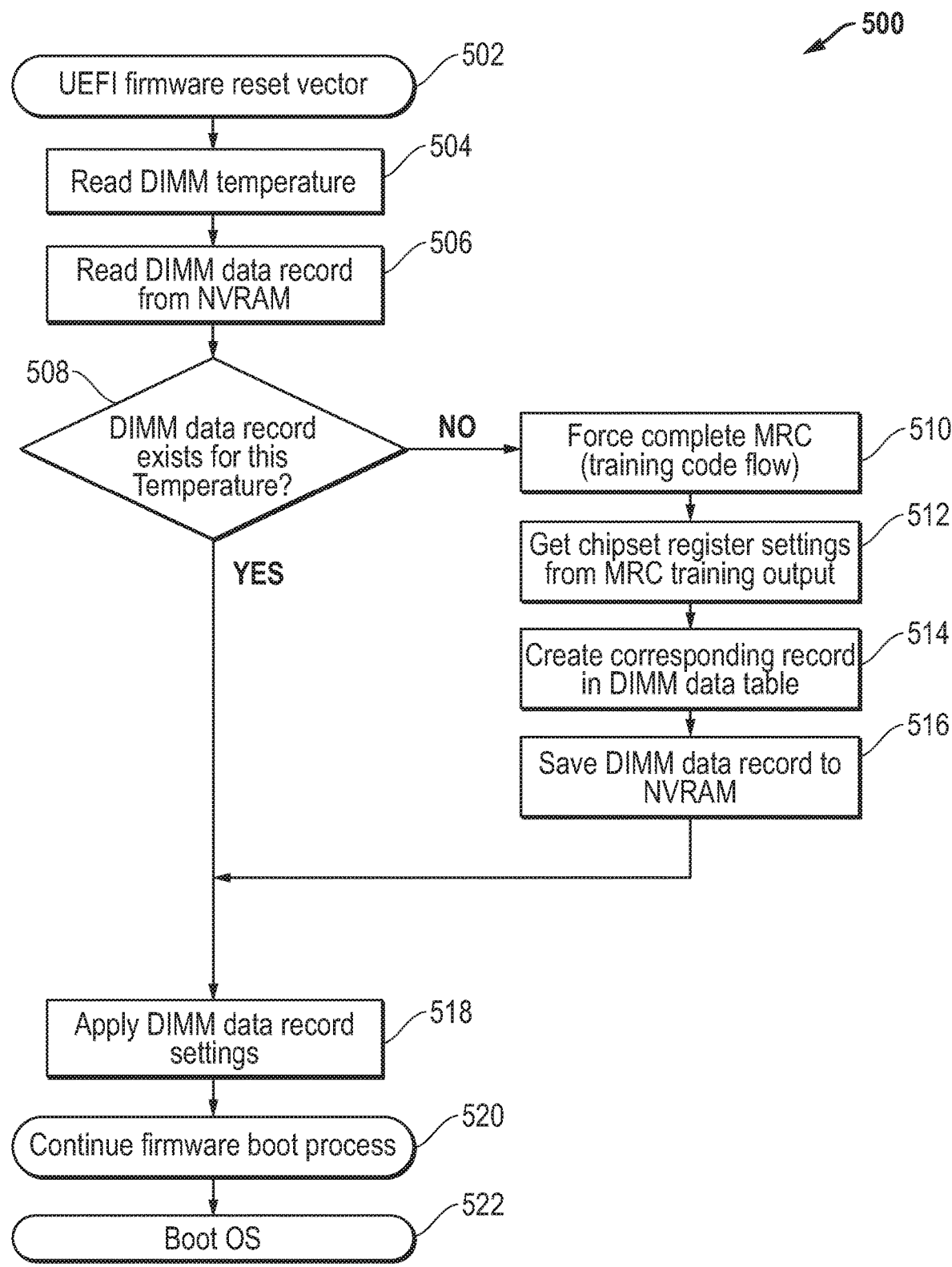
FIG. 5 illustrates an ad-hoc memory configuration setting creation process according to one exemplary embodiment of the disclosed systems and methods.

FIG. 5 illustrates another exemplary embodiment of the disclosed systems and methods in which an ad-hoc process 500 may be implemented (e.g., at every system boot) to create memory configuration setting values for system memory 120 (e.g., one or more DIMMs) for a memory temperature or temperature range for which a data record of memory configuration setting values does not currently exist. Using the methodology of FIG. 5, BIOS 194 may build a table of memory configuration settings in an ad-hoc manner for a range of different memory temperatures, but without requiring an iterative burn-in (learning process) such as employed in steps 206-218 of FIG. 2. For example, each time MRC 186 coincidentally runs at a new temperature, the memory configuration table entry for that new memory temperature may be populated. At the same time, while the memory configuration table is not fully populated, the BIOS may be configured to select the memory configuration settings (e.g., memory timing and drive voltage) of the nearest existing memory configuration table entry to the current memory temperature.

Advantageously, ad-hoc process 500 of FIG. 5 may be implemented in one embodiment to determine memory configuration settings for relatively cold operating memory temperatures, e.g., including relatively cold temperatures encountered in the field that cannot otherwise be duplicated during factory assembly. Example ranges of such relatively cold field memory temperatures include, but are not limited to, memory temperatures less than 0° C., memory temperatures less −10° C., memory temperatures less than −20° C., memory temperatures less than −30° C., memory temperatures less than −40° C., memory temperatures between 0° C. and −50° C., memory temperatures between −10° C. and −50° C., and memory temperatures between −20° C. and −50° C. However, ad-hoc process 500 may also be performed at other greater or lesser memory temperatures, including at relatively hot memory operating temperatures such as at temperatures within the same elevated memory operating temperature ranges, relatively cold memory operating temperature ranges, and other temperatures and temperature ranges previously described for the memory burn-in process embodiment of FIG. 2. In one embodiment, such relatively cold temperatures may be forced for ad-hoc testing of FIG. 5, e.g., by positioning the system 100 within an refrigerated environment that has cooled the temperature of system 100 and its memory 120 to the desired relatively cold temperature, and then booting the device and executing process 500 at the cooled temperature to create memory configuration settings for the selected relatively cold temperature.

Process 500 starts in step 502 with Unified Extensible Firmware Interface (UEFI) BIOS reset vector (e.g., at system power up or system reset such as restart or any other operation that causes system reboot) pointing CPU 110 to load UEFI BIOS 194 from SPI Flash 190. Current temperature of system memory 120 is then read from temperature sensor 112 by CPU 110 via EC 180 in step 504, and MCST 193 is then read in step 506 from system NVRAM (e.g., SPI Flash 160) to determine if a data record (e.g., a memory configuration table entry/row of FIG. 4) exists at or near the current memory temperature read in step 504. In this regard, a predefined temperature range window (e.g., 5° F., 10° F., etc.) around the temperature of existing data records may be selected in one embodiment for determining whether or not a data record exists corresponding to a current memory temperature read in step 504, e.g., a 10° F. temperature range window for a 95° F. data record would range from 90° F. to 100° F., and a 5° F. temperature range window for a 95° F. data record would range from 92.5° F. to 97.5° F. If at step 508 a data record is found to exist in MCST 193 having a window that overlaps with the current read memory temperature (e.g., an existing data record for 95° F. overlaps with a current read memory temperature of 97° F. when a predefined temperature range window of 5° F. or 10° F. is selected), then process 500 proceeds to step 518 where the data record corresponding to the current memory temperature is applied by CPU 110 for writing to and reading from system memory 120, and then on to step 520 where the normal system firmware boot process is continued and the OS 101 is booted in step 522.

However, if in step 508 no data record is found to exist in MCST 193 that corresponds to (overlaps with) the current memory temperature (e.g., an existing data record for 95° F. does not overlap with a current read memory temperature of 98° F. when a predefined temperature range window of 5° F. is selected), then process 500 proceeds to step 510 where BIOS 194 forces execution of a complete burn-in training process at the current memory temperature by MRC 186 in a manner as previously described in relation to FIGS. 3A and 3B. Process 500 then proceeds to step 512 where the chipset register MRC settings are retrieved from the MRC training output created in the steps of FIGS. 3A and 3B. These chipset register MRC settings include the determined median memory timing value and median memory drive voltage value for the current memory temperature reported by temperature sensor 112. The chipset register MRC settings are used in step 514 to create a data record (e.g., populate a memory configuration table entry/row of FIG. 4) that includes the MRC settings measured during MRC training flow of FIGS. 3A-3B corresponding to the current temperature reported by temperature sensor 112 via EC 180 to CPU 110. In one embodiment, this data record is then saved in step 516 to MCST 193 (e.g., as a memory configuration table entry row of a DIMM table such as illustrated in FIG. 4) on system NVRAM (e.g., SPI Flash 160) for later use by a BIOS thermal event handler executed by CPU 110. Process 500 then proceeds to steps 518 where the newly created data record of steps 514 and 516 corresponding to the current memory temperature is applied by CPU 110 for writing to and reading from system memory 120, and then to step 520 where the normal system firmware boot process is continued and the OS 101 is booted in step 522.

Figure 6:
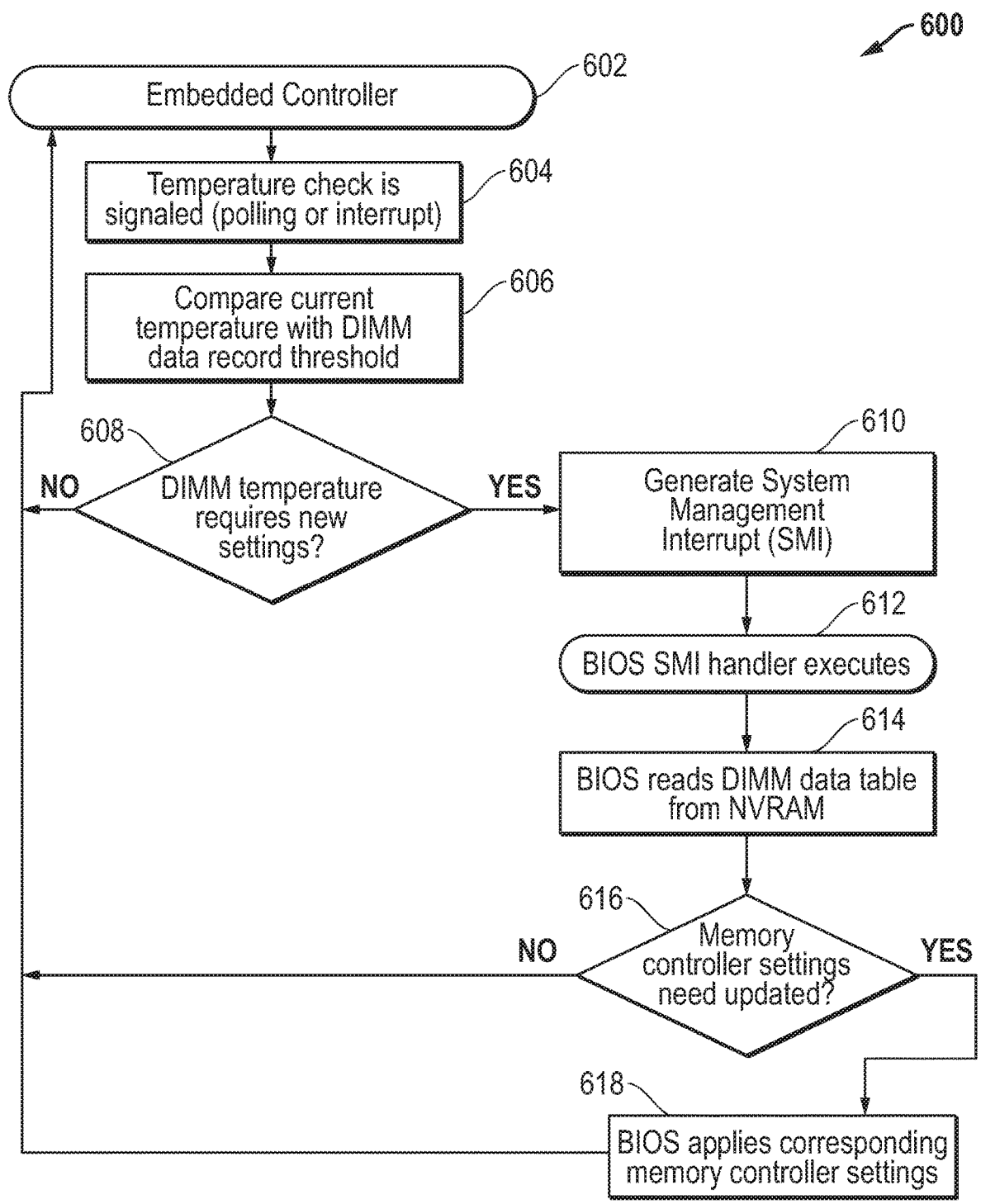
FIG. 6 illustrates runtime behavior according to one exemplary embodiment of the disclosed systems and methods.

FIG. 6 illustrates runtime behavior methodology 600 performed by EC 180 and CPU 110 according to one exemplary embodiment of the disclosed systems and methods, for example, after booting the OS 101 of system 100 at the end of methodologies of FIGS. 2 and 5, or in any other case where a relationship (e.g., lookup table) of different memory configuration setting values at different memory temperatures (such as MCST 193) exists on SPI Flash memory device 190.

As shown, methodology 600 starts in step 602 with EC 180 operating during runtime of information handling system 100. EC 180 retrieves current temperature of system memory 120 from temperature sensor 112 in step 604 (e.g., by polling or interrupt) and forwards same to CPU 110. In step 606, BIOS 194 executing on CPU 110 then compares the current memory temperature from step 604 to the designated temperature (threshold) of the memory configuration settings being currently employed by memory controller 103 to determine whether the currently employed memory configuration settings correspond to the current memory temperature. Then in step 608, CPU 110 determines if new memory configuration settings are required.

Specifically, new memory configuration settings are determined to be indicated in step 608 if the currently employed memory configuration settings are do not correspond to the current memory temperature (e.g., the current memory temperature has changed to be closer to the data record temperature of another different set of memory configuration settings), whereas new memory configuration settings are determined not to be indicated if the currently employed memory configuration settings correspond to the current memory temperature (e.g., the current memory temperature remains closer to the data record temperature of the currently employed set of memory configuration settings than to the data record temperature of any other available memory configuration settings). In this regard a temperature range may be defined symmetrically around each given data record temperature, and the memory configuration settings corresponding to the given data record temperature selected for use when the measured current memory temperature value lies within the temperature range corresponding to the given data record temperature. For example, where data record temperatures of memory configuration settings are spaced at 10° intervals, then a set of memory configuration settings for 90° F. may be employed for a range of measured current memory temperature values from 85° F. to 94.9° F., while a different set of memory configuration settings for 100° F. may be employed for a range of measured current memory temperature values from 95° F. to 104.9° F. It will be understood that the above criteria for step 608 are exemplary only, and that other greater or lesser temperature values, temperature intervals, or other criteria may be employed in step 608.

In the case that new memory configuration settings are determined not to be required in step 608, then methodology 600 returns to step 602 and repeats. However, if new memory configuration settings are determined to be required in step 608 (i.e., in the case where the currently employed memory configuration settings do not correspond to the current memory temperature), then methodology 600 proceeds to step 610 where BIOS 194 on CPU 110 generates a system management interrupt (SMI), and then to step 612 where the BIOS SMI handler executes.

BIOS 194 then reads the memory configuration settings corresponding to the current memory temperature, e.g. From the MCST 193 (e.g., DIMM data table) that is stored on SPI Flash 190 in step 614, and determines in step 616 if the memory configuration settings to employed by memory controller 103 need updating for the current memory temperature. For example, in one embodiment memory configurations settings (e.g., memory timing and memory drive voltage) will be updated in step 616 if there is an existing entry in the memory configuration table of MCST 193 that corresponds to a temperature that is closer to the measured current memory temperature than is the temperature corresponding to the currently-employed memory configuration settings. If so, then methodology 600 proceeds to step 618 where BIOS 194 on CPU 110 applies the new memory configuration settings to MC 103 that are read from MCST 193 corresponding to the current memory temperature, and then returns to step 602 and repeats. However, if there is not an entry in the memory configuration table of MCST 193 that corresponds to a temperature that is closer to the measured current memory temperature than the temperature corresponding to the currently-employed memory configuration settings, then methodology 600 returns from step 616 to step 602 and repeats without updating the current memory configuration settings for MC 103. This may be the case, for example, where the memory configuration settings for the new measured current memory temperature are the same as the current memory configuration settings selected for the previously measured memory temperature (including where no memory configuration settings exist in an entry for the current memory temperature that are different from the current memory configuration settings), or otherwise where no change to memory configuration settings is indicated by the new measured current memory temperature.

It will be understood that the steps of FIGS. 2, 3A, 3B, 5 and 6 are exemplary only, and that any combination of fewer, additional and/or alternative steps may be employed that are suitable for creating and/or using multiple sets of memory configuration settings.

It will also be understood that one or more of the tasks, functions, or methodologies described herein (e.g., including those described herein for components 110, 130, 150, 180, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein.

It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and systems may be utilized in various combinations and/or independently. Thus the invention is not limited to only those combinations shown herein, but rather may include other combinations.

What is claimed is:

1. A method, comprising:
operating an information handling system that comprises at least one programmable integrated circuit coupled to random access memory (RAM) and coupled to non-volatile memory (NVM), the RAM being at least one of dynamic RAM (DRAM) or synchronous DRAM (SDRAM);
using the programmable integrated circuit of the information handling system to create and/or modify memory configuration settings for the RAM by performing the following memory configuration setting determination steps for each given one of multiple different RAM operating temperatures:
reading data to and writing data from the RAM while varying the value of at least one memory configuration parameter until one or more errors occur while reading data to and writing data from the RAM, and
selecting a designated value of the memory configuration parameter for use at the given RAM operating temperature where no error occurred while reading data to and writing data from the RAM;
creating a relationship between different given RAM operating temperatures and the designated memory configuration setting value designated for use at each one of the different given RAM operating temperatures; and
storing the created relationship as memory configuration settings in the NVM of the information handling system.

2. The method of claim 1, where the at least one memory configuration parameter is memory timing and/or memory drive strength.

3. The method of claim 1, where the at least one memory configuration parameter comprises each of memory timing and memory drive strength.

4. A method, comprising:
operating an information handling system that comprises at least one programmable integrated circuit coupled to random access memory (RAM) and coupled to non-volatile memory (NVM);
using the programmable integrated circuit of the system to create and/or modify memory configuration settings for the RAM by performing the following memory configuration setting determination steps for each given one of multiple different RAM operating temperatures:
reading data to and writing data from the RAM while varying the value of at least one memory configuration parameter until one or more errors occur while reading data to and writing data from the RAM, and selecting a designated value of the memory configuration parameter for use at the given RAM operating temperature where no error occurred while reading data to and writing data from the RAM;

creating a relationship between different given RAM operating temperatures and the designated memory configuration setting value designated for use at each one of the different given RAM operating temperatures;

storing the created relationship as memory configuration settings in the NVM of the information handling system; and using the programmable integrated circuit of the system to create the memory configuration settings for the RAM during a memory burn-in process; and where the method further comprises:

determining during system power up or system reset whether the memory burn-in process is required based on criteria comprising at least one of current status of memory configuration settings stored in the system NVM, a flag currently stored in the system NVM, or a value or state of a variable currently stored in NVM, and then performing the memory configuration setting determination steps for each given one of multiple different RAM operating temperatures as part of the memory burn-in process prior to booting the system only if it is determined that the memory burn-in process is required.

5. The method of claim 4, further comprising using the programmable integrated circuit to execute basic input/output system (BIOS) code to create the memory configuration settings for the RAM during the memory burn-in process.

6. The method of claim 4, where the programmable integrated circuit comprises a central processing unit (CPU); and where the NVM comprises a serial peripheral interface (SPI) Flash chip.

7. The method of claim 4, where the criteria comprises determination of an absence of any existing memory configuration setting values currently stored in NVM, or a flag currently stored in the system NVM; and where the method further comprises using the programmable integrated circuit of the system to automatically perform the memory configuration setting determination steps as the burn-in process prior to booting the system.

8. The method of claim 4, where the criteria comprises determination of a presence of a value or state of a variable currently stored in the system NVM that indicates memory burn-in is required; and where the method further comprises using the programmable integrated circuit of the system to prompt a human user of the information handling system to initiate memory configuration burn-in according to burn-in testing process;

then receive a user command from the human user to perform the memory burn-in process; and then perform the memory configuration setting determination steps as the memory burn-in process in response to the receipt of the user command.

9. The method of claim 8, further comprising using the programmable integrated circuit of the system to set the value or state of the variable currently stored in the system NVM to indicate that memory burn-in is required in response to detection of current existence of at least one of the following conditions by the programmable integrated circuit of the system: detection of a RAM system memory configuration change; detection of an error-correcting code (ECC) memory failure in the case where no previous memory burn-in test process has been previously performed; detection of a variable update on the NVM that has been performed via Extensible Firmware Interface (EFI) runtime code by an operating system (OS) executing on a programmable integrated circuit of the system; detection of expiration of a pre-defined time interval since last performance of a memory burn-in process on the RAM system memory; or detection of occurrence of a fatal system error or system crash.

10. A method, comprising:

operating an information handling system that comprises at least one programmable integrated circuit coupled to random access memory (RAM) and coupled to non-volatile memory (NVM);

using the programmable integrated circuit of the system to create and/or modify memory configuration settings for the RAM by performing the following memory configuration setting determination steps for each given one of multiple different RAM operating temperatures:

reading data to and writing data from the RAM while varying the value of at least one memory configuration parameter until one or more errors occur while reading data to and writing data from the RAM, and selecting a designated value of the memory configuration parameter for use at the given RAM operating temperature where no error occurred while reading data to and writing data from the RAM;

creating a relationship between different given RAM operating temperatures and the designated memory configuration setting value designated for use at each one of the different given RAM operating temperatures;

storing the created relationship as memory configuration settings in the NVM of the information handling system; and using the programmable integrated circuit of the system to create the memory configuration settings during each system power up or system reset and prior to each attempted booting of an operating system (OS) on a programmable integrated circuit of the information handling system by:

sensing a current operating temperature of the RAM prior to booting an operating system (OS) on a programmable integrated circuit of the information handling system, then accessing any memory configuration settings that are already stored in the NVM to determine if a memory configuration setting value entry corresponding to the current sensed RAM operating temperature already exists in the NVM of the information handling system, then performing the memory configuration setting determination steps to create and store a memory configuration setting value entry corresponding to the current sensed RAM operating temperature in the NVM of the information handling system prior to booting the system only if it is determined that the memory configuration setting value entry corresponding to the current operating temperature does not already exist in the NVM, and then applying the memory configuration setting value that corresponds to the current sensed RAM operating temperature for reading and writing to the RAM and booting the OS, and then using the applied memory configuration setting value for reading and writing to the RAM after the OS is booted, where the method is performed multiple different times to create and store multiple different memory configuration setting value entries corresponding to multiple different current sensed RAM operating temperatures in the NVM of the information handling system.

11. The method of claim 10, where each different memory configuration setting value entry comprises a predefined RAM operating temperature range and a corresponding value of the memory configuration parameter that is designated for use to read and write to the system RAM for any current sensed RAM operating temperature that falls within the predefined RAM operating temperature range.

12. A method, comprising:
   a) operating an information handling system that comprises at least one programmable integrated circuit coupled to random access memory (RAM) and coupled to non-volatile memory (NVM), the RAM being at least one of dynamic RAM (DRAM) or synchronous DRAM (SDRAM);
   b) sensing a current operating temperature of the RAM while operating the information handling system;
   c) then using the programmable integrated circuit of the information handling system to access a relationship stored on the NVM between different given RAM operating temperatures and corresponding memory configuration setting values for at least one memory configuration parameter designated for use at each one of the different given RAM operating temperatures;
   d) then selecting and retrieving a memory configuration setting value from the NVM that is designated for use at the current sensed operating temperature of the RAM; and
   e) then reading and writing from the RAM using the current selected memory configuration setting value designated for use at the current sensed operating temperature of the RAM.

13. The method of claim 12, further comprising iteratively repeating steps b) to e) multiple times during the same system runtime session following a single system boot.

14. The method of claim 12, where the at least one memory configuration parameter is memory timing and/or memory drive strength.

15. The method of claim 12, where each different memory configuration setting value entry comprises a predefined RAM operating temperature range and a corresponding value of the memory configuration parameter that is designated for use to read and write to the system RAM for any current sensed RAM operating temperature that falls within the predefined RAM operating temperature range.

16. A method, comprising:
   a) operating an information handling system that comprises at least one programmable integrated circuit coupled to random access memory (RAM) and coupled to non-volatile memory (NVM);
   b) sensing a current operating temperature of the RAM while operating the information handling system;
   c) then using the programmable integrated circuit of the information handling system to access a relationship stored on the NVM between different given RAM operating temperatures and corresponding memory configuration setting values for at least one memory configuration parameter designated for use at each one of the different given RAM operating temperatures;
   d) then selecting and retrieving a memory configuration setting value from the NVM that is designated for use at the current sensed operating temperature of the RAM; and
   e) then reading and writing from the RAM using the current selected memory configuration setting value designated for use at the current sensed operating temperature of the RAM;

where the method further comprises reading and writing from the RAM using at least one first memory configuration setting value for at least one memory configuration parameter; then sensing a current operating temperature of the RAM while reading and writing to the RAM using the at least one first memory configuration setting value; and then using the programmable integrated circuit of the information handling system to access the relationship stored on the NVM to determine if the first memory configuration setting value entry corresponds to the current sensed RAM operating temperature, and then using the programmable integrated circuit of the information handling system to only one of:
   retrieve at least one second memory configuration setting value entry corresponding to the current sensed RAM operating temperature from the NVM of the information handling system that is different from the first memory configuration setting value entry, and apply the second memory configuration setting value for reading and writing to the RAM only if it is determined that the first memory configuration setting value entry does not correspond to the current sensed RAM operating temperature, or
   continue to use the first memory configuration setting value for reading and writing to the RAM only if it is determined that either the first memory configuration setting value corresponds to the current sensed RAM operating temperature or that there is no second memory configuration setting value entry stored in the relationship on the NVM that corresponds to the current sensed RAM operating temperature.

17. An information handling system, comprising:
system random access memory (RAM), the RAM being at least one of dynamic RAM (DRAM) or synchronous DRAM (SDRAM);
system non-volatile memory (NVM);
at least one temperature sensor; and
at least one programmable integrated circuit coupled to the system RAM and the system NVM;
where the at least one programmable integrated circuit is programmed to:
   a) sense a current operating temperature of the RAM while operating the information handling system,
   b) then access a relationship stored on the NVM between different given RAM operating temperatures and corresponding memory configuration setting values for at least one memory configuration parameter designated for use at each one of multiple different given RAM operating temperatures,
   c) then select and retrieve a memory configuration setting value from the NVM that is designated for use at the current sensed operating temperature of the RAM, and
   d) then read and write from the RAM using the current selected memory configuration setting value designated for use at the current sensed operating temperature of the RAM.

18. The system of claim 17, where the at least one programmable integrated circuit is programmed to iteratively repeat a) to d) multiple times during the same system runtime session following a single system boot.

19. The system of claim 17, where the at least one memory configuration parameter is memory timing and/or memory drive strength.

20. An information handling system, comprising:
   system random access memory (RAM);
   system non-volatile memory (NVM);
   at least one temperature sensor;
   at least one programmable integrated circuit coupled to the system RAM and the system NVM;
   where the at least one programmable integrated circuit is programmed to:
   a) sense a current operating temperature of the RAM while operating the information handling system,
   b) then access a relationship stored on the NVM between different given RAM operating temperatures and corresponding memory configuration setting values for at least one memory configuration parameter designated for use at each one of multiple different given RAM operating temperatures,
   c) then select and retrieve a memory configuration setting value from the NVM that is designated for use at the current sensed operating temperature of the RAM, and
   d) then read and write from the RAM using the current selected memory configuration setting value designated for use at the current sensed operating temperature of the RAM;
   where the at least one programmable integrated circuit is further programmed to create and/or modify memory configuration settings for the RAM by performing the following sequence for each given one of multiple different RAM operating temperatures:
   reading data to and writing data from the RAM while varying the value of at least one memory configuration parameter until one or more errors occur while reading data to and writing data from the RAM,
   selecting a designated value of the memory configuration parameter for use at the given RAM operating temperature where no error occurred while reading data to and writing data from the RAM at each of the varying values of the memory configuration parameter,
   creating a relationship between different given RAM operating temperatures and the designated memory configuration setting value designated for use at each one of the different given RAM operating temperatures, and
   storing the created relationship as memory configuration settings in the NVM of the information handling system.

* * * * *